US010468090B1

(12) United States Patent
Nishizaki

(10) Patent No.: US 10,468,090 B1
(45) Date of Patent: Nov. 5, 2019

(54) MULTILAYERED NETWORK OF POWER SUPPLY LINES

(71) Applicant: MICRON TECHNOLOGY, INC., Boise, ID (US)

(72) Inventor: Mamoru Nishizaki, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/127,030

(22) Filed: Sep. 10, 2018

(51) Int. Cl.
| | | |
|---|---|---|
| *G11C 11/40* | (2006.01) | |
| *G11C 11/4074* | (2006.01) | |
| *G11C 7/06* | (2006.01) | |
| *G11C 11/4091* | (2006.01) | |
| *G11C 5/14* | (2006.01) | |
| *G11C 5/06* | (2006.01) | |

(52) U.S. Cl.
CPC ............ *G11C 11/4074* (2013.01); *G11C 5/14* (2013.01); *G11C 7/06* (2013.01); *G11C 11/4091* (2013.01); *G11C 5/063* (2013.01)

(58) Field of Classification Search
None
See application file for complete search history.

(56) References Cited

U.S. PATENT DOCUMENTS

| | | | | |
|---|---|---|---|---|
| 5,748,550 A | * | 5/1998 | Jeon | ..................... H01L 23/5286 365/226 |
| 7,808,804 B2 | * | 10/2010 | Kwon | ..................... G11C 5/063 365/226 |
| 2006/0056219 A1 | * | 3/2006 | Araki | .................. H01L 23/5286 365/63 |
| 2006/0126416 A1 | * | 6/2006 | Eun | ......................... G11C 5/063 365/226 |
| 2008/0112203 A1 | * | 5/2008 | Kwon | ..................... G11C 5/063 365/63 |

* cited by examiner

*Primary Examiner* — Tan T. Nguyen
(74) *Attorney, Agent, or Firm* — Dorsey & Whitney LLP

(57) ABSTRACT

Disclosed herein is an apparatus that includes a first wiring layer including a first power line extending in a first direction, a second wiring layer including second and third power lines extending in a second direction, a third wiring layer including power electrode patterns arranged in the second direction, and a fourth wiring layer including a fourth power line extending in the second direction. The first and second power lines are connected by a first via electrode. The first and third power lines are connected by a second via electrode. The second power line and each of the power electrode patterns are connected by a third via electrode. The third power line and each of the power electrode patterns are connected by a fourth via electrode. The fourth power line and each of the power electrode patterns are connected by a fifth via electrode.

20 Claims, 8 Drawing Sheets

MULTILAYERED NETWORK OF POWER SUPPLY LINES

BACKGROUND

A semiconductor chip such as a DRAM includes a hierarchically established power line network. It is desirable that the power line network is low resistive as much as possible. Particularly, it is desirable that a power line for supplying a power supply voltage to a circuit block requiring a large consumption current is sufficiently low resistive.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
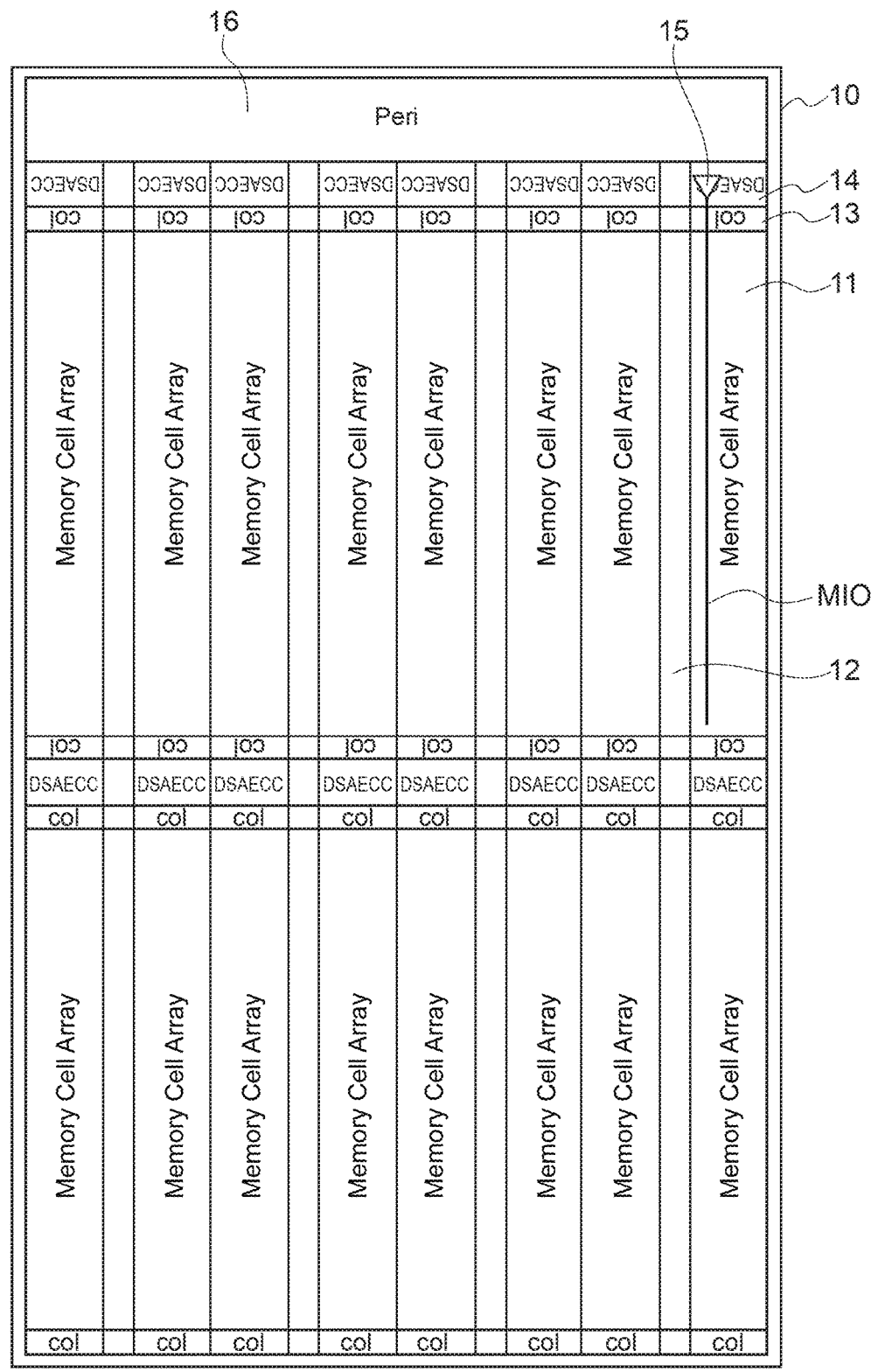
FIG. 1 is a plan view showing a layout of a semiconductor device according to the present disclosure.

A semiconductor device 10 shown in FIG. 1 may be a DRAM, and may include memory cell arrays 11, row decoders 12, and column decoders 13. Each of the row decoders 12 performs row access to a corresponding memory cell array 11. Each of the column decoders 13 performs column access to a corresponding memory cell array 11. A memory cell selected by the row decoder 12 and the column decoder 13 is connected to a data sense amplifier 15 arranged in one of amplifier regions 14 via a main I/O line MIO. The data sense amplifier 15 amplifies read data read from the memory cell via the main I/O line MIO, and buffers write data to be written in the memory cell via the main I/O line MIO. Because the main I/O line MIO has a long wire length, the consumption current of the data sense amplifier 15 is relatively large. Operations of the row decoders 12, the column decoders 13, and the data sense amplifier 15 are controlled by a peripheral circuit 16.

Figure 2:
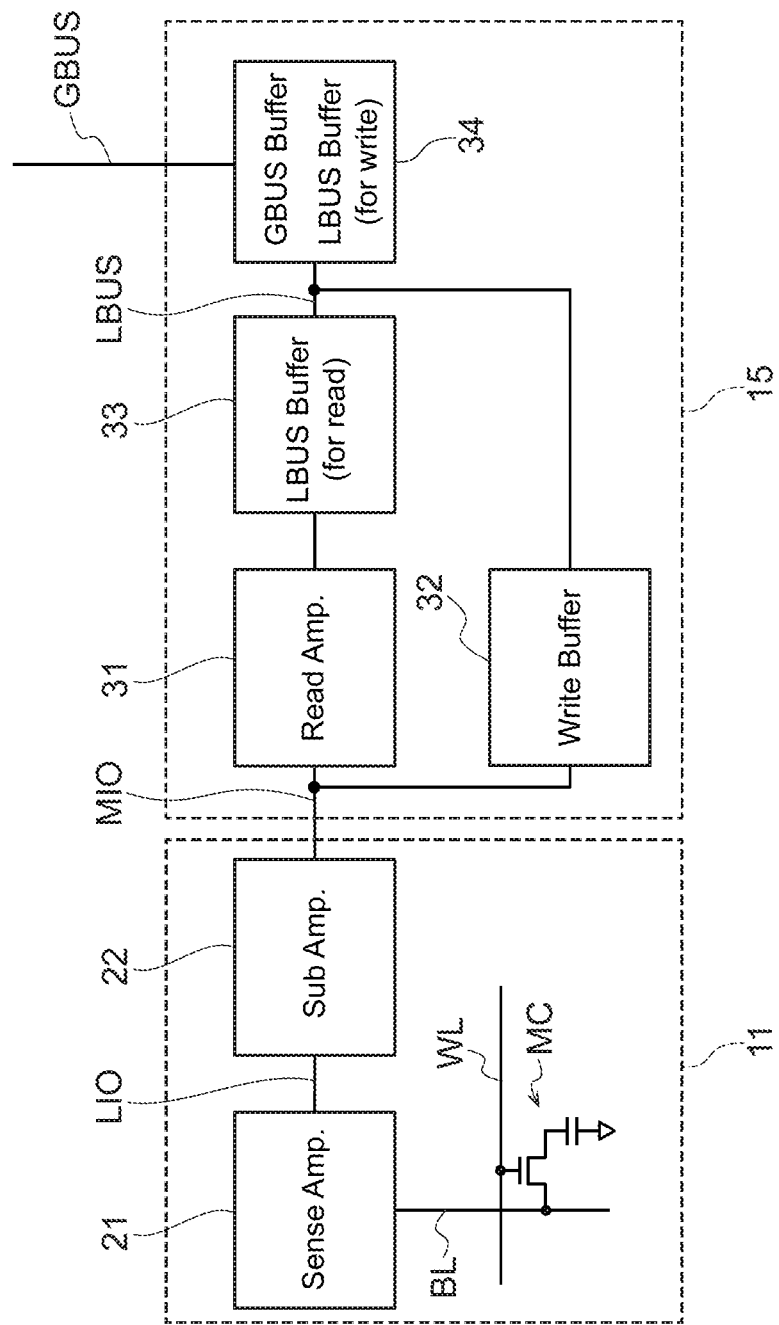
FIG. 2 is a block diagram showing a configuration of a data sense amplifier according to the present disclosure.

A plurality of memory cells MC shown in FIG. 2 are provided in each of the memory cell arrays 11. Each of the memory cells MC is arranged at an intersection of a word line WL selected by the row decoder 12 and a bit line BL selected by the column decoder 13. The bit line BL is connected to a sense amplifier 21. The sense amplifier 21 is connected to a sub amplifier 22 via a local I/O line LIO.

The sub amplifier 22 is connected to the data sense amplifier 15 via the main I/O line MIO. As shown in FIG. 2, the data sense amplifier 15 may include a read amplifier 31, a write buffer 32, an LBUS buffer 33, and a GBUS buffer 34. At the time of a read operation, read data supplied from the main I/O line MIO is amplified by the read amplifier 31, and then transferred to a local bus LBUS via the LBUS buffer 33. The read data transferred to the local bus LBUS is transferred to a global bus GBUS via the GBUS buffer 34. At the time of a write operation, write data supplied from the global bus GBUS is transferred to the local bus LBUS via the GBUS buffer 34. The write data transferred to the local bus LBUS is transferred to the main I/O line MIO via the write buffer 32.

Figure 3:
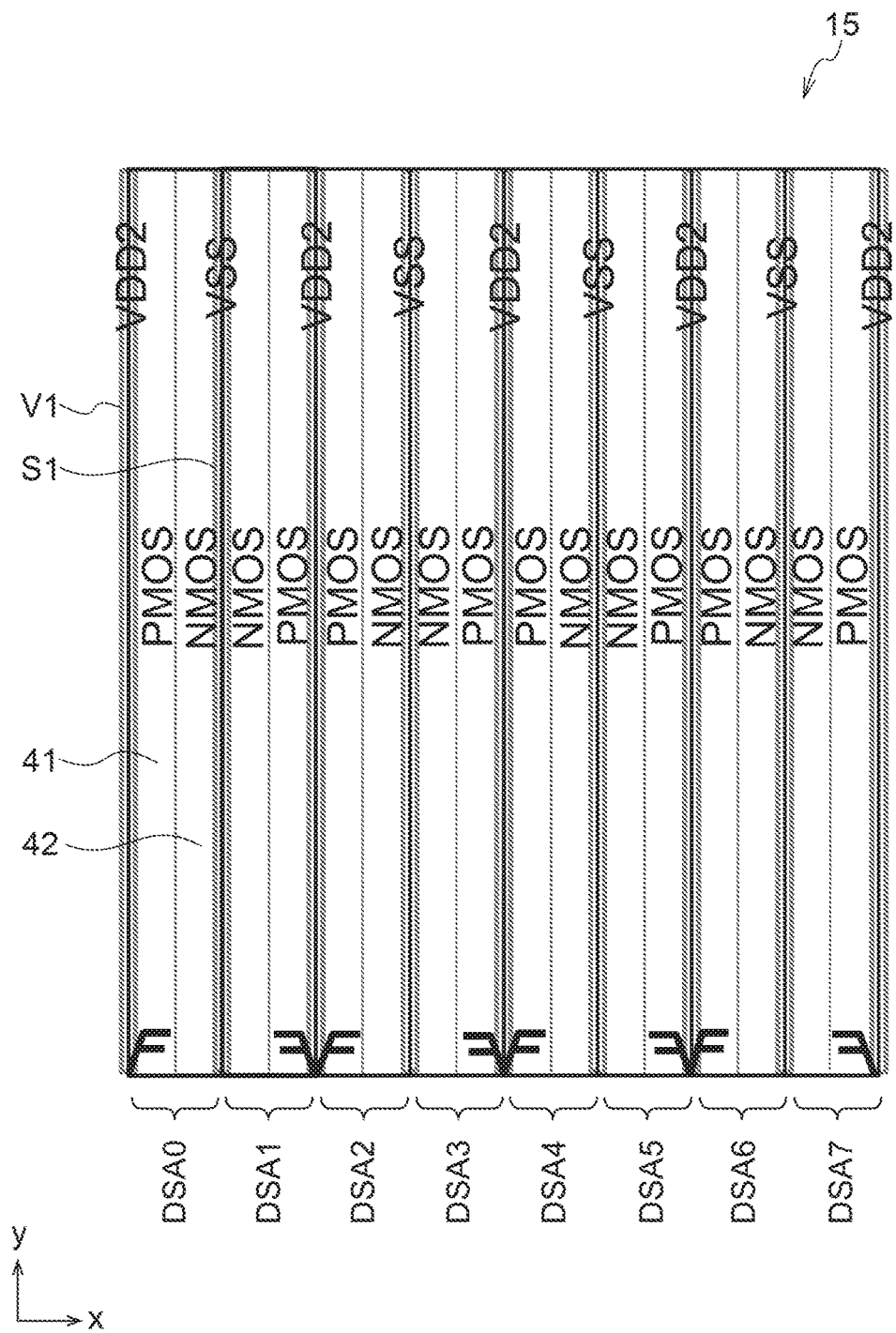
FIG. 3 is a plan view showing a layout of a data sense amplifier corresponding to one mat.

FIG. 3 shows a layout of the data sense amplifier 15 corresponding to one mat of the memory cell array 11. As shown in FIG. 3, the data sense amplifier 15 corresponding to one mat is constituted by eight data sense amplifiers DSA0 to DSA7. Each of the data sense amplifiers DSA0 to DSA7 may perform a read/write operation for two bits. Therefore, data of 16 bits may be simultaneously input and output with respect to a selected mat. Each of the data sense amplifiers DSA0 to DSA7 includes a PMOS region 41 in which a P-channel MOS transistor is arranged and an NMOS region 42 in which an N-channel MOS transistor is arranged. The data sense amplifiers DSA0, DSA2, DSA4, and DSA6 and the data sense amplifiers DSA1, DSA3, DSA5, and DSA7 are positioned in a mutually reversed manner in an x direction of the PMOS region 41 and the NMOS region 42. A power line V1 or S extending in a y direction is arranged on adjacent ones of the data sense amplifiers DSA0 to DSA7. The power line V1 is arranged on the PMOS region 41 that is positioned on a border between adjacent ones of the data sense amplifiers DSA0 to DSA7, and supplies a power potential VDD2 to a source of the P-channel MOS transistor arranged in the PMOS region 41. The power line S1 is arranged on the NMOS region 42 positioned on a border between adjacent ones of the data sense amplifiers DSA0 to DSA7, and supplies a grounding potential VSS to a source of the N-channel MOS transistor arranged in the NMOS region 42. In this manner, each of the data sense amplifiers DSA0 to DSA7 is sandwiched between the power line V1 and the power line S1 in a plan view. As described later, the power lines V1 and S1 are provided on a first wiring layer.

Figure 4:
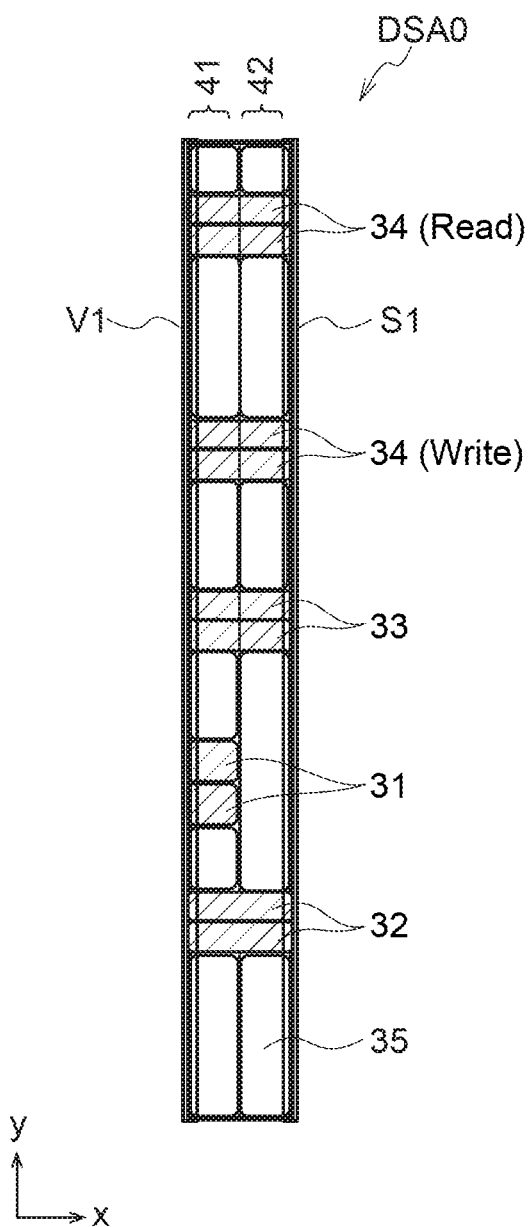
FIG. 4 is a plan view showing a layout of two data sense amplifiers.

As shown in FIG. 4, the read amplifier 31, the write buffer 32, the LBUS buffer 33, and the GBUS buffer 34 for two bits included in the data sense amplifier DSA0 may be dispersively arranged in the y direction. Particularly, the read amplifier 31, the write buffer 32, the LBUS buffer 33, and the GBUS buffer 34 are circuits requiring a large consumption current among circuits constituting the data sense amplifier DSA0. A logic circuit and the like requiring a small consumption current are arranged in a remaining area 35. In the GBUS buffer 34, a circuit 34 (Read) used for a read operation and a circuit 34 (Write) used for a write operation are respectively arranged in different areas. As described later, the power lines V1 and S1 are respectively connected to different power lines provided on an upper wiring layer at a plurality of portions in the y direction. With this configuration, the power potential VDD2 and the grounding potential VSS are stably supplied to circuit blocks requiring a large consumption current that are dispersively arranged in the y direction.

Figure 5:
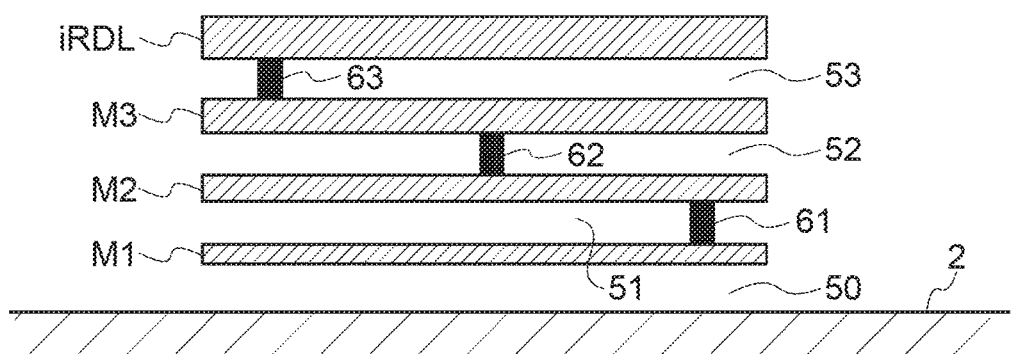
FIG. 5 is a schematic cross-sectional view showing wiring layers included in the semiconductor device according to the present disclosure.

As shown in FIG. 5, the semiconductor device 10 according to the present embodiment may include at least four wiring layers M1, M2, M3, and iRDL. The wiring layer M1 is a lowermost wiring layer provided on a semiconductor substrate 2 via an insulating layer 50. The wiring layer M2 is a second wiring layer provided on the wiring layer M1 via an insulating layer 51. The wiring layer M3 is a third wiring layer provided on the wiring layer M2 via an insulating layer 52. The wiring layer iRDL is an uppermost wiring layer provided on the wiring layer M3 via an insulating layer 53. The wiring layer M1 and the wiring layer M2 are connected to each other via a via conductor 61 that is provided while penetrating the insulating layer 51. The wiring layer M2 and the wiring layer M3 are connected to each other via a via conductor 62 that is provided while penetrating the insulating layer 52. The wiring layer M3 and the wiring layer iRDL are connected to each other via a via conductor 63 that is provided while penetrating the insulating layer 53. A power line and a signal line are formed on each of the wiring layers M1, M2, M3, and iRDL. The wiring width and the wiring thickness of the power line and the signal line may be larger in upper wiring layers as compared to those in lower wiring layers.

Figure 6:
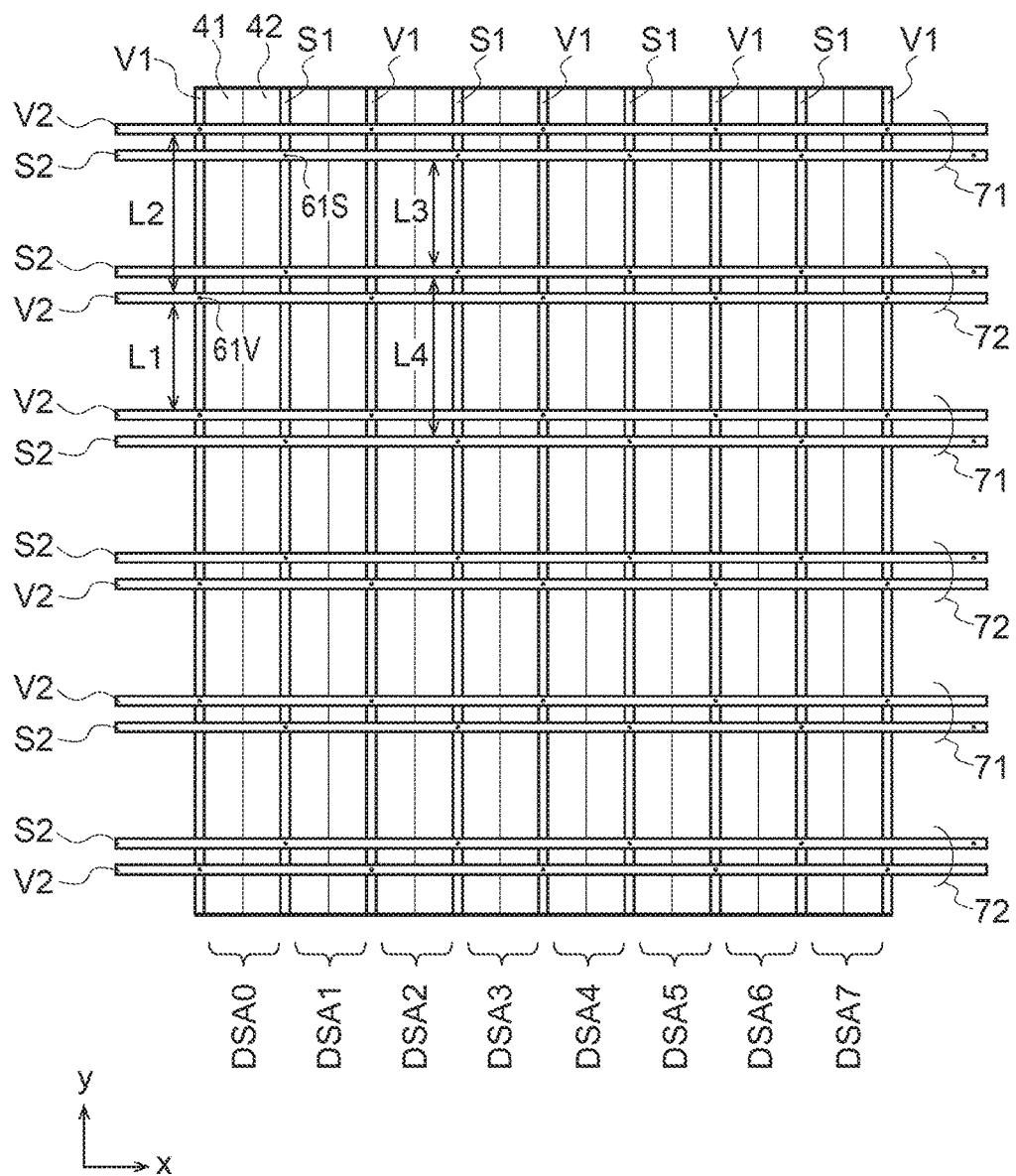
FIGS. 6 to 8 are layout diagrams of a power line network.

FIG. 6 shows a layout on the data sense amplifiers DSA0 to DSA7 of a power line formed on the wiring layers M1 and M2. As shown in FIG. 6, the power lines V1 and S1 extending in they direction are alternately arrayed in the x direction on the wiring layer M1. An array pitch of the power lines V1 and S1 in the x direction matches the width of the data sense amplifiers DSA0 to DSA7 in the x direction. The wiring layer M1 may also include another power supply wiring and another signal wiring extending in y direction between the power line V1 and the power line S1. On the other hand, two power lines V2 and two power lines S2 extending in the x direction are alternately arrayed in the y direction on the wiring layer M2. In other words, a first pair line 71 in which the power line V2 and the power line S2 are adjacently arrayed in this order and a second pair line 72 in which the power line S2 and the power line V2 are adjacently arrayed in this order appear alternately in the y direction. The wiring layer M2 may also include another power supply wiring and another signal wiring extending in the x direction between the power line V2 and the power line S2. In the present embodiment, a total of six pairs of the first and second pair lines 71 and 72 are provided. A via conductor 61V is provided at intersection of the power line V1 and the power line V2, thereby electrically connecting the power line V1 and the power line V2 to each other. A via conductor 61S is provided at intersection of the power line S1 and the power line S2, thereby electrically connecting the power line S1 and the power line S2 to each other. As a result, the power line V1 extending in the y direction is connected to the power line V2 positioned on an upper layer at six positions, and the power line S1 extending in the y direction is connected to the power line S2 positioned on an upper layer at six positions. The sizes of spaces between two adjacent via conductors 61V and 61S in the y direction are not the same. That is, a space between two via conductors 61V adjacent to each other in the y direction is a space L1 in a section in which two power lines V2 are adjacent to each other in the y direction, and is a space L2 (>L1) in a section in which two power lines S2 are interposed between two power lines V2. Similarly, a space between two via conductors 61S adjacent to each other in the y direction is a space L3 in a section in which two power lines S2 are adjacent to each other in the y direction, and is a space L4 (>L3) in a section in which two power lines V2 are interposed between two power lines S2. The sizes of the space L1 and the space L3 may be the same. The sizes of the space L2 and the space LA may be the same.

Figure 7:
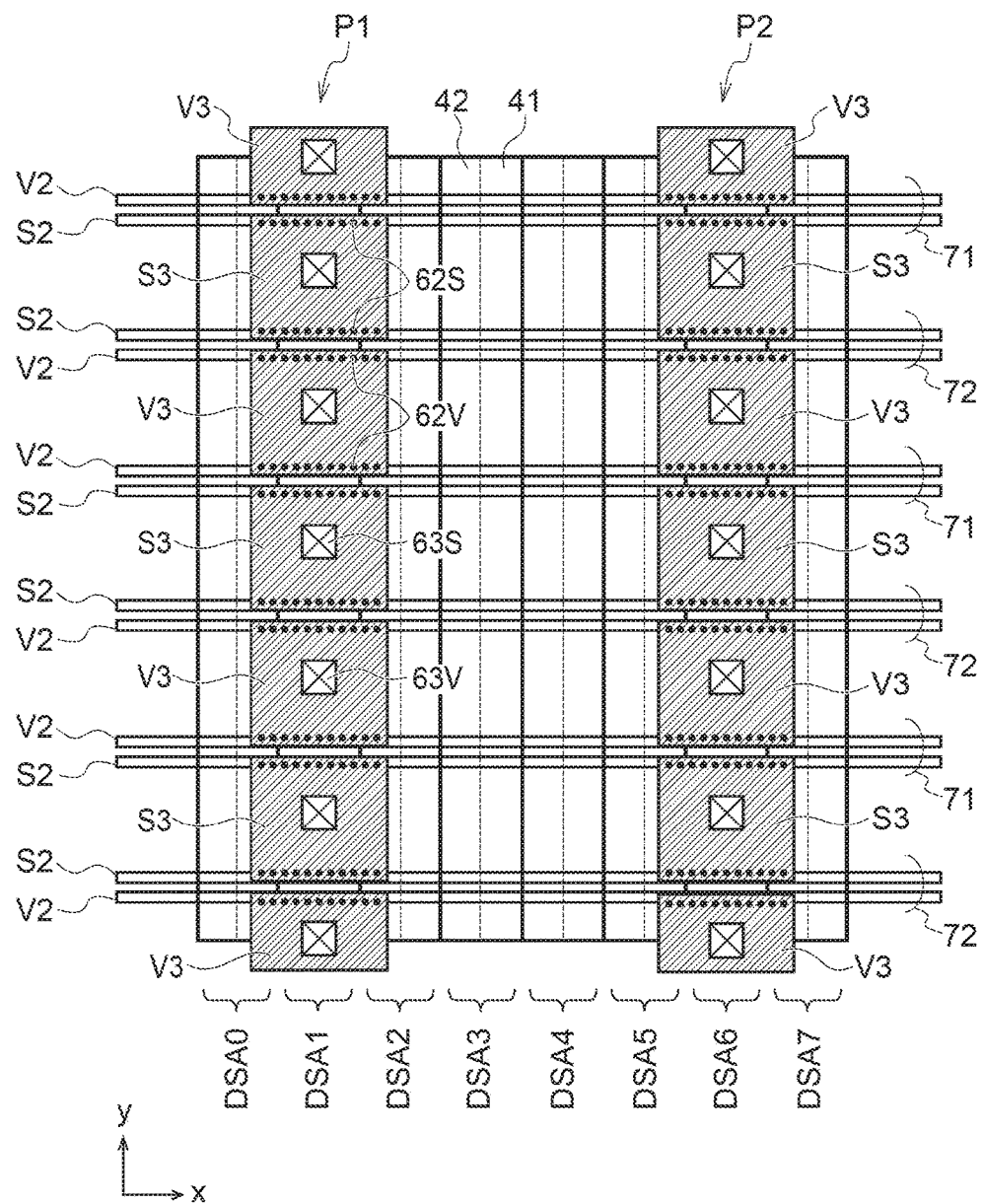

FIG. 7 shows a layout of a power line formed on the wiring layers M2 and M3 on the data sense amplifiers DSA0 to DSA7. Island-like power supply patterns V3 and S3 that are alternately arrayed in the y direction are provided on the wiring layer M3 as shown in FIG. 7. Both ends of the power supply pattern V3 in the y direction overlap on the power lines V2 formed on the wiring layer M2, and the power supply patterns V3 and S3 are connected to each other via a plurality of via conductors 62V arranged on the both ends. Similarly, both ends of the power supply pattern S3 in the y direction overlap on the power lines S2 formed on the wiring layer M2, and the power supply patterns V3 and S3 are connected to each other via a plurality of via conductors 62S provided on the both ends. Both of the via conductors 62V and 62S are provided in plural in the x direction, thereby realizing low resistivity. In the present embodiment, two pattern arrays P1 and P2 in which the power supply patterns V3 and S3 are alternately arrayed in the y direction are allocated with respect to eight data sense amplifiers DSA0 to DSA7 corresponding to one mat. The power supply pattern V3 included in the pattern array P1 and the power supply pattern V3 included in the pattern array P2 are adjacent to each other in the x direction, and the power supply pattern S3 included in the pattern array P1 and the power supply pattern S3 included in the pattern array P2 are adjacent to each other in the x direction. The wiring layer M3 may also include another power supply wiring and another signal wiring extending in the y direction between the pattern array P1 and the pattern array P2.

Figure 8:
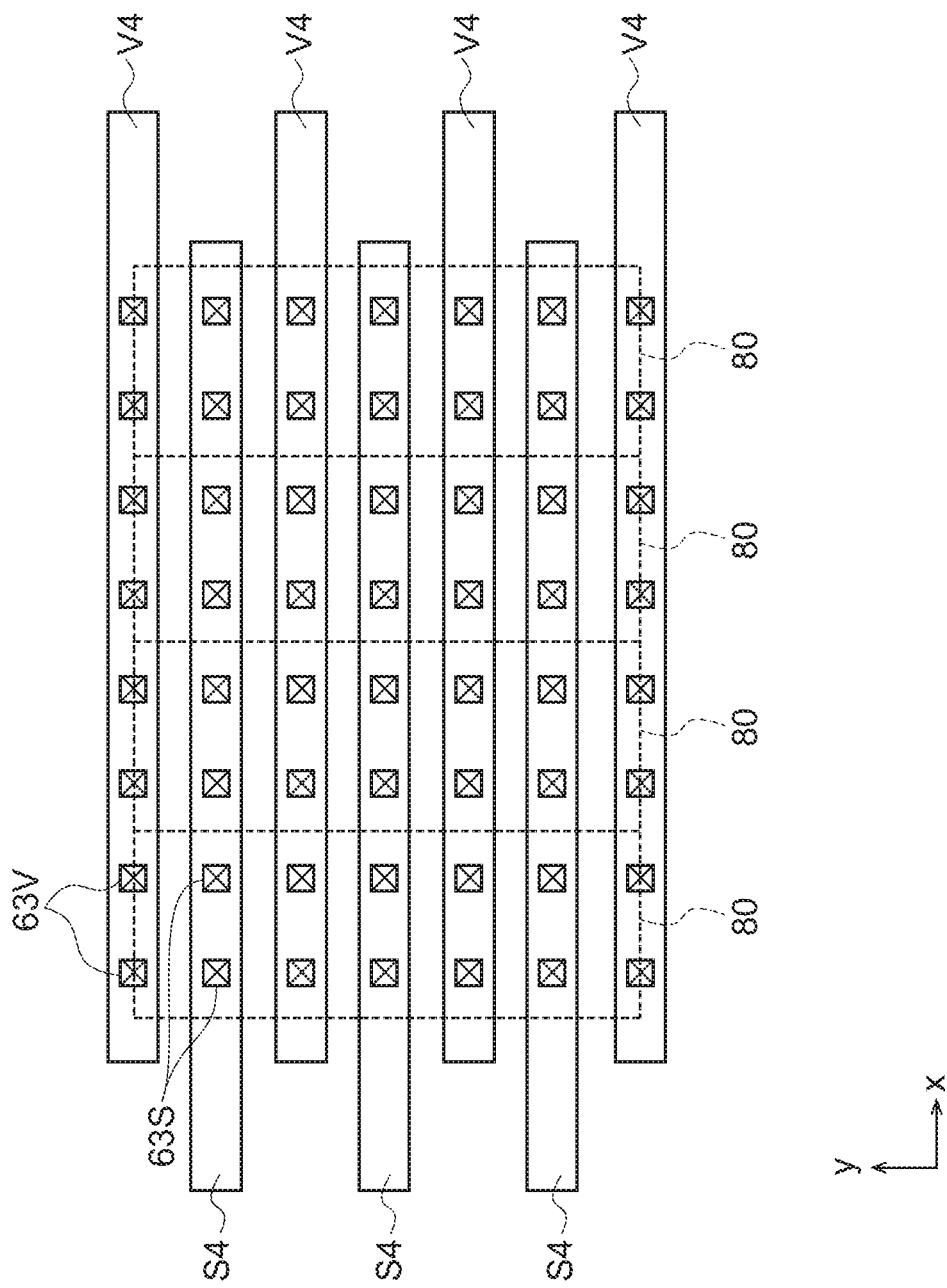

As shown in FIG. 8, power lines V4 and S4 extending in the x direction are provided on the wiring layer iRDL. The power supply pattern V3 is connected to the power line V4 via a via conductor 63V, and the power supply pattern S3 is connected to the power line S4 via a via conductor 63S. Reference numeral 80 shown in FIG. 8 indicates a region in which eight data sense amplifiers DSA0 to DSA7 corresponding to one mat are provided. The power lines V4 and S4 are alternately arrayed in the y direction, and are respectively connected to associated ones of the power supply patterns V3 and S3 via the via conductors 63V and 63S.

In this manner, in the semiconductor device 10 according to the present embodiment, because the power supply patterns V3 and S3 include the pattern arrays P1 and P2 alternately arrayed in the y direction, the number of the via conductors 62V connecting the power supply pattern V3 and the power line V2 to each other and the number of the via conductors 62S connecting the power supply pattern S3 and the power line S2 to each other are increased. For example, as compared to a case where the power line V3 extending in the y direction is arranged at the same position as the pattern array P1 and the power line S3 extending in the y direction is arranged at the same position as the pattern array P2, the numbers of the via conductors 62V and 62S become twice. Accordingly, because the resistance value of the power line network that supplies the power potentials VDD2 and VSS to the data sense amplifier 15 becomes lower, it becomes possible to supply a larger amount of current to the data sense amplifier 15.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first wiring layer including a first power line extending in a first direction;
a second wiring layer including second and third power lines extending in a second direction substantially perpendicular to the first direction;
a third wiring layer including a plurality of first power electrode patterns arranged in the second direction, each of the first power electrode patterns overlapping with the second and third power lines; and
a fourth wiring layer including a fourth power line extending in the second direction;
wherein the first power line and the second power line are connected to each other by a first via electrode arranged at intersection of the first and second power lines,
wherein the first power line and the third power line are connected to each other by a second via electrode arranged at intersection of the first and third power lines,
wherein the second power line and each of the first power electrode patterns are connected to each other by a third via electrode arranged at a position overlapping with each other,
wherein the third power line and each of the first power electrode patterns are connected to each other by a fourth via electrode arranged at a position overlapping with each other, and
wherein the fourth power line and each of the first power electrode patterns are connected to each other by a fifth via electrode arranged at a position overlapping with each other.

2. The apparatus of claim 1, wherein the third wiring layer further includes a plurality of signal lines extending in the first direction such that the signal lines are arranged between two of the first power electrode patterns adjacent in the second direction.

3. The apparatus of claim 2,
wherein the first wiring layer further includes a fifth power line extending in the first direction,
wherein the second wiring layer further includes sixth and seventh power lines extending in the second direction,
wherein the third wiring layer further includes a plurality of second power electrode patterns arranged in the second direction, each of the second power electrode patterns overlapping with the sixth and seventh power lines,
wherein the fourth wiring layer further includes an eighth power line extending in the second direction,
wherein the fifth power line and the sixth power line are connected to each other by a sixth via electrode arranged at intersection of the fifth and sixth power lines,
wherein the fifth power line and the seventh power line are connected to each other by a seventh via electrode arranged at intersection of the fifth and seventh power lines, wherein the sixth power line and each of the second power electrode patterns are connected to each other by an eighth via electrode arranged at a position overlapping with each other,
wherein the seventh power line and each of the second power electrode patterns are connected to each other by a ninth via electrode arranged at a position overlapping with each other, and
wherein the eighth power line and each of the second power electrode patterns are connected to each other by a tenth via electrode arranged at a position overlapping with each other.

4. The apparatus of claim 3, wherein each of the first power electrode patterns is adjacent to an associated one of the second power electrode patterns in the first direction.

5. The apparatus of claim 4, wherein the signal lines are arranged between two of the second power electrode patterns adjacent in the second direction.

6. The apparatus of claim 3,
wherein the first power line has a first section between the first and second via electrodes,
wherein the fifth power line has a second section between the sixth and seventh via electrodes, and
wherein the first and second sections have substantially the same length as each other.

7. The apparatus of claim 3,
wherein the first to fourth power lines are supplied with a first power potential, and
wherein the fifth to eighth power lines are supplied with a second power potential different from the first power potential.

8. The apparatus of claim 3,
wherein the second wiring layer further includes ninth and tenth power lines extending in the second direction,
wherein the third wiring layer further includes a plurality of third power electrode patterns arranged in the second direction, each of the third power electrode patterns overlapping with the ninth and tenth power lines,
wherein the fourth wiring layer further includes an eleventh power line extending in the second direction,
wherein the first power line and the ninth power line are connected to each other by an eleventh via electrode arranged at intersection of the first and ninth eleventh power lines,
wherein the first power line and the tenth power line are connected to each other by a twelfth via electrode arranged at intersection of the first and tenth power lines,
wherein the ninth power line and each of the third power electrode patterns are connected to each other by a thirteenth via electrode arranged at a position overlapping with each other,
wherein the tenth power line and each of the third power electrode patterns are connected to each other by a fourteenth via electrode arranged at a position overlapping with each other, and
wherein the eleventh power line and each of the third power electrode patterns are connected to each other by a fifteenth via electrode arranged at a position overlapping with each other.

9. The apparatus of claim 8, wherein each of the second power electrode patterns is arranged between an associated one of the first power electrode patterns and an associated one of the third power electrode patterns.

10. The apparatus of claim 8,
wherein the first power line has a first section between the first and second via electrodes and a second section between the second and eleventh via electrodes, and
wherein the second section is longer than the first section.

11. The apparatus of claim 10,
wherein the first power line further has a third section between the eleventh and twelfth via electrodes, and
wherein the first and third sections have substantially the same length as each other.

12. The apparatus of claim 8,
wherein the second wiring layer further includes twelfth and thirteenth power lines extending in the second direction,
wherein the third wiring layer further includes a plurality of fourth power electrode patterns arranged in the second direction, each of the fourth power electrode patterns overlapping with the twelfth and thirteenth power lines,
wherein the fourth wiring layer further includes a fourteenth power line extending in the second direction,
wherein the fifth power line and the twelfth power line are connected to each other by a sixteenth via electrode arranged at intersection of the fifth and twelfth eleventh power lines,
wherein the fifth power line and the thirteenth power line are connected to each other by a seventeenth via electrode arranged at intersection of the fifth and thirteenth power lines,
wherein the twelfth power line and each of the fourth power electrode patterns are connected to each other by an eighteenth via electrode arranged at a position overlapping with each other,
wherein the thirteenth power line and each of the fourth power electrode patterns are connected to each other by a nineteenth via electrode arranged at a position overlapping with each other, and
wherein the fourteenth power line and each of the fourth power electrode patterns are connected to each other by a twentieth via electrode arranged at a position overlapping with each other.

13. The apparatus of claim 12, wherein each of the first power electrode patterns is arranged between an associated one of the second power electrode patterns and an associated one of the fourth power electrode patterns.

14. The apparatus of claim 12,
wherein the first power line has a first section between the first and second via electrodes, a second section between the second and eleventh via electrodes, and a third section between the eleventh and twelfth via electrodes,
wherein the fifth power line has a fourth section between the sixth and seventh via electrodes, a fifth section between the sixth and seventeenth via electrodes, and a sixth section between the sixteenth and seventeenth via electrodes,
wherein the second section is longer than each of the first and third sections, and
wherein the fifth section is longer than each of the fourth and sixth sections.

15. The apparatus of claim 14, wherein the second and fifth sections have substantially the same length as each other.

16. An apparatus comprising:
a plurality of first power electrode patterns and a plurality of second power electrode patterns alternately arranged in a first direction, the first power electrode patterns being supplied with a first power potential, the second power electrode patterns being supplied with a second power potential different from the first power potential;
a plurality of first power lines and a plurality of second power lines extending in a second direction substantially perpendicular to the first direction, the first and second power lines being formed on a different wiring layer from the first and second power electrode patterns;
a plurality of first via electrode groups each including a plurality of first via electrodes each connecting an associated one of the first power lines to an associated one of the first power electrode patterns; and
a plurality of second via electrode groups each including a plurality of second via electrodes each connecting an associated one of the second power lines to an associated one of the second power electrode patterns,
wherein the first via electrodes included in each of the first via electrode groups are arranged in the second direction along an edge of an associated one of the first power electrode patterns, and
wherein the second via electrodes included in each of the second via electrode groups are arranged in the second direction along an edge of an associated one of the second power electrode patterns.

17. The apparatus of claim 16, wherein two first power lines and two second power lines are alternately arranged in the first direction.

18. The apparatus of claim 16, further comprising a data sense amplifier operates on a voltage between the first and second power potentials.

19. An apparatus comprising:
a plurality of first power electrode patterns and a plurality of second power electrode patterns alternately arranged in a first direction, the first power electrode patterns being supplied with a first power potential, the second power electrode patterns being supplied with a second power potential different from the first power potential;
a plurality of pairs of first power lines and a plurality of pairs of second power lines extending in a second direction substantially perpendicular to the first direction, the pairs of first and second power lines being alternately arranged in the first direction,
a plurality of first via conductors each connecting one of an associated one of pairs of the first power lines to an associated one of the first power electrode patterns at one end of an associated one of the first power electrode patterns in the first direction;
a plurality of second via conductors each connecting other of an associated one of pairs of the first power lines to an associated one of the first power electrode patterns at other end of an associated one of the first power electrode patterns in the first direction;
a plurality of third via conductors each connecting one of an associated one of pairs of the second power lines to an associated one of the second power electrode patterns at one end of an associated one of the second power electrode patterns in the first direction; and
a plurality of fourth via conductors each connecting other of an associated one of pairs of the second power lines to an associated one of the second power electrode patterns at other end of an associated one of the second power electrode patterns in the first direction.

20. The apparatus of claim 19, further comprising:
third and fourth power lines extending in the first direction;
a plurality of fifth via conductors each connecting the third power line to an associated one of the first power lines;
a plurality of sixth via conductors each connecting the fourth power line to an associated one of the second power lines; and
a data sense amplifier operates on a voltage between the first and second power potentials,
wherein the data sense amplifier is arranged between the third and fourth power lines.

* * * * *